United States Patent
Tamaki et al.

(10) Patent No.: US 7,630,124 B2
(45) Date of Patent: Dec. 8, 2009

(54) WAVELENGTH CONVERSION DEVICE AND WAVELENGTH CONVERSION METHOD

(75) Inventors: Yusuke Tamaki, Kanagawa (JP); Masashi Oshima, Tokyo (JP); Yutaka Imai, Tokyo (JP)

(73) Assignee: Sony Corporation, Tokyo (JP)

( * ) Notice: Subject to any disclaimer, the term of this patent is extended or adjusted under 35 U.S.C. 154(b) by 218 days.

(21) Appl. No.: 11/764,999

(22) Filed: Jun. 19, 2007

(65) Prior Publication Data
US 2009/0046351 A1 Feb. 19, 2009

(30) Foreign Application Priority Data
Jun. 22, 2006 (JP) .............................. 2006-172822

(51) Int. Cl.
*G02F 1/35* (2006.01)
*G02F 2/02* (2006.01)

(52) U.S. Cl. ......................................... 359/326; 372/92

(58) Field of Classification Search ......... 359/326–332; 372/92, 96, 98
See application file for complete search history.

(56) References Cited

U.S. PATENT DOCUMENTS

| 5,027,361 | A | | 6/1991 | Kozlovsky et al. | |
| 5,321,718 | A | * | 6/1994 | Waarts et al. | 372/108 |
| 5,434,700 | A | * | 7/1995 | Yoo | 359/332 |
| 5,594,745 | A | * | 1/1997 | Oka | 372/21 |
| 6,249,371 | B1 | * | 6/2001 | Masuda et al. | 359/326 |

* cited by examiner

*Primary Examiner*—Daniel Petkovsek
(74) *Attorney, Agent, or Firm*—Sonnenschein Nath & Rosenthal LLP

(57) ABSTRACT

A wavelength conversion device is disclosed. The wavelength conversion device includes at least a fundamental wave light source and an external resonator, where a reflectance $R_{in}$ of an input coupling element that inputs light from the fundamental wave light source to the external resonator is selected as represented by the equations 1 and 2, when a frequency jitter of the fundamental wave light source is $\Delta f_{jitter}$, a resonator length of the external resonator is $L_{cav}$, a frequency line width of the external resonator is $\Delta v_{cav}$, a total internal loss of the external resonator is $\delta$, and a speed of light is c.

$$\Delta v_{cav} = \frac{c}{L_{cav}} \times \frac{1-\sqrt{R_{in}(1-\delta)}}{\pi(R_{in}(1-\delta))^{1/4}} \quad (1)$$

$$\Delta v_{cav} \geq \Delta f_{jitter} \quad (2)$$

6 Claims, 9 Drawing Sheets

Δνcav=2.8MHz
Tin=10%
Rin=99.0%

FIG. 6

Δνcav=4.0MHz
Tin=2.0%
Rin=98.0%

WAVELENGTH CONVERSION DEVICE AND WAVELENGTH CONVERSION METHOD

CROSS REFERENCES TO RELATED APPLICATIONS

The present invention contains subject matter related to Japanese Patent Application JP 2006-172822 filed in the Japanese Patent Office on Jun. 22, 2006, the entire contents of which being incorporated herein by reference.

BACKGROUND OF THE INVENTION

1. Field of the Invention

The present invention relates to a wavelength conversion device including a fundamental wave light source and an external resonator, and a wavelength conversion method.

2. Description of the Related Art

A wavelength conversion device including a fundamental wave light source and an external resonator having a nonlinear optical crystal is generally used as a laser light source that oscillates light of a short wavelength laser such as an ultraviolet laser.

Figure 1:
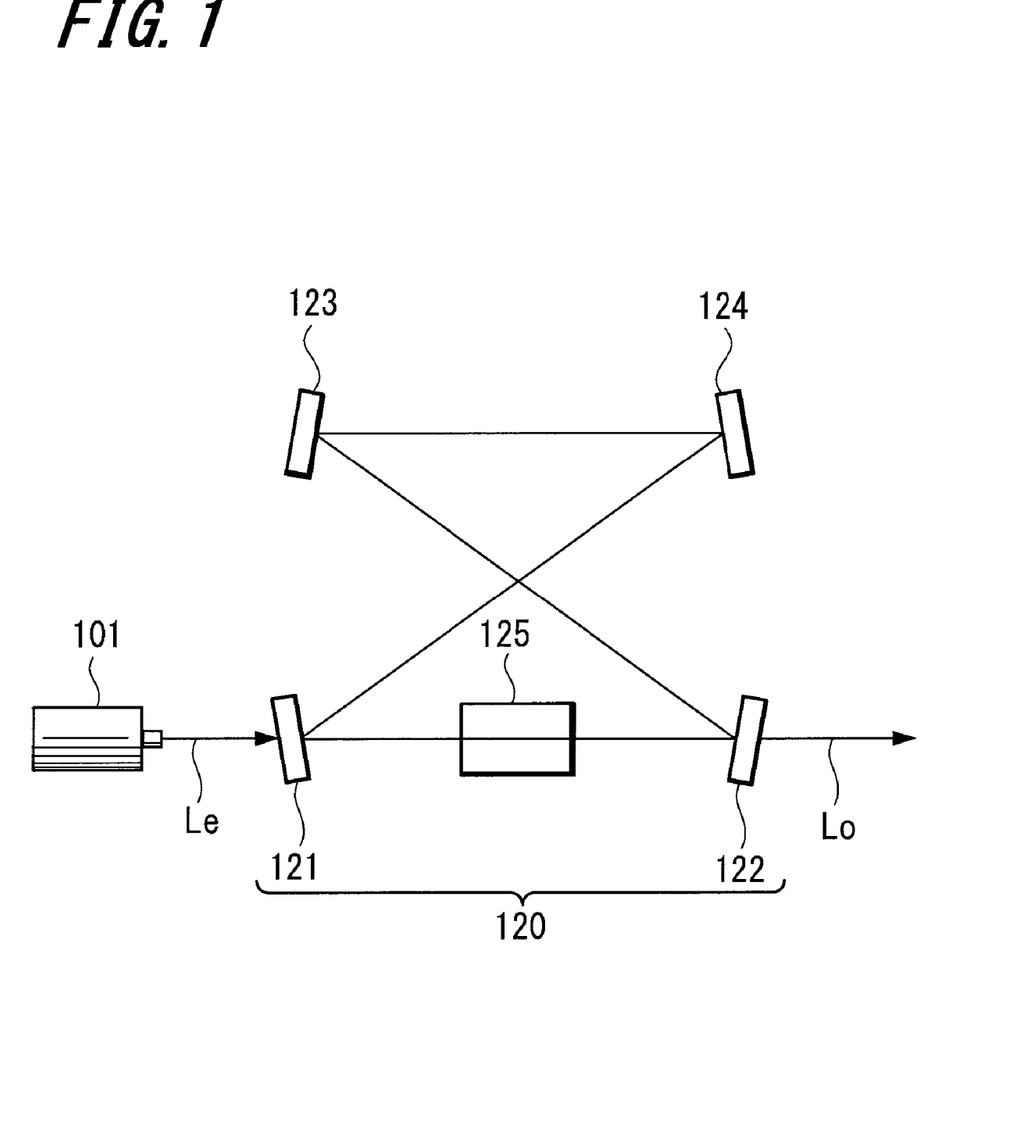
FIG. 1 is a schematic configuration diagram of an example of a wavelength conversion device.

FIG. 1 is a schematic configuration diagram of an example of a wavelength conversion device. The wavelength conversion device includes a fundamental wave light source 101 and an external resonator 120. The external resonator 120 includes an input coupling element 121 having a mirror with a predetermined transmittance, mirrors 122 to 124, and a nonlinear optical crystal 125 placed between the input coupling element 121 and the mirror 122. Fundamental wave light for excitation Le emitted from the fundamental wave light source 101 is employed in the external resonator 120 from the input coupling element 121, and is emitted as second harmonic light Lo, for example, to the outside from the mirror 122 having a predetermined transmittance, for example.

Impedance matching is performed as a main method to determine a reflectance (transmittance) of the input coupling element 121 of the related art. In this method, an internal loss of the external resonator is first figured out, and a loss of the input coupling element is determined in order to match with the obtained internal loss. In this case, wavelength conversion efficiency is maximized by selecting a reflectance of the input coupling element so that impedance is matched with the internal loss.

By contrast, U.S. Pat. No. 5,027,361 discloses a method of determining a reflectance of an input coupling element by not only performing impedance matching but also taking a nonlinear loss into consideration.

SUMMARY OF THE INVENTION

When using light having a relatively short wavelength obtained by the aforementioned wavelength conversion device, an intensity noise of a laser may have to be reduced. When laser scanning is performed to obtain an image, for example, an intensity noise of a laser causes deterioration in image quality. For example, when laser light in an ultraviolet region is used for an apparatus of inspecting a defect on a wafer, inspection accuracy is affected if an intensity noise is generated merely in a short time. In such a wafer inspection apparatus, a wafer is scanned with laser light at a speed of about 100 km/h or more to detect a defect on the wafer based on a reflected light intensity. At this point, an irradiation time per spot is about 0.3 μs. Accordingly, when an output is decreased in a fraction of a second due to an intensity noise, reflected light may be dark at a width of 0.3 μs and a black spot is formed in the scanned place. Properties of the inspection apparatus may be significantly impaired due to a black spot regarded as a defect.

According to an embodiment of the present invention, reducing a noise of wavelength converted light may be achieved.

According to an embodiment of the present invention, there is provided a wavelength conversion device including at least a fundamental wave light source and an external resonator. In the wavelength conversion device, a reflectance $R_{in}$ of an input coupling element that inputs light from the fundamental wave light source to the external resonator is selected as represented by the equations 1 and 2, when a frequency jitter of the fundamental wave light source is $\Delta f_{jitter}$, a resonator length of the external resonator is $L_{cav}$, a frequency line width of the external resonator is $\Delta v_{cav}$, a total internal loss of the external resonator is $\delta$, and a speed of light is c.

$$\Delta v_{cav} = \frac{c}{L_{cav}} \times \frac{1 - \sqrt{R_{in}(1-\delta)}}{\pi(R_{in}(1-\delta))^{1/4}} \quad (1)$$

$$\Delta v_{cav} \geq \Delta f_{jitter} \quad (2)$$

According to another embodiment of the present invention, there is provided a wavelength conversion method including the step of inputting light emitted from a fundamental wave light source to an external resonator to perform wavelength conversion. In the wavelength conversion method, a reflectance $R_{in}$ of an input coupling element that inputs light from the fundamental wave light source to the external resonator is selected as represented by the equations 1 and 2, when a frequency jitter of the fundamental wave light source is $\Delta f_{jitter}$, a resonator length of the external resonator is $L_{cav}$, a frequency line width of the external resonator is $\Delta v_{cav}$, a total internal loss of the external resonator is $\delta$, and a speed of light is c.

As described above, in a wavelength conversion device or a wavelength conversion method according to an embodiment of the present invention, a reflectance $R_{in}$ of an input coupling element in an external resonator is selected as represented by the equations 1 and 2.

In the related art, a reflectance of an input coupling element in an external resonator is selected to be almost equal to an internal loss of the external resonator in order to perform impedance matching.

In contrast, according to an embodiment of the present invention, a frequency jitter of a fundamental wave light source that is a noise source for wavelength converted light may be reduced. Further, according to an embodiment of the present invention, in view of a frequency line width of a resonator $\Delta v_{cav}$, a noise appearing in wavelength converted light may be reduced by selecting a reflectance of an input coupling element $R_{in}$ according to properties of a fundamental wave light source, so that the frequency line width $\Delta v_{cav}$ is more significant than a frequency jitter of the fundamental wave light source $f_{jitter}$ as represented by the equation 2.

Thus, according to an embodiment of the present invention, a noise of wavelength converted light caused by such a frequency jitter of a fundamental wave light source may be reliably reduced. In the related art, a semiconductor laser such as a distributed feedback semiconductor laser or a external resonator diode laser may be difficult to use as a fundamental wave light source in a wavelength conversion device, because a frequency jitter is relatively high. However, such a relatively inexpensive and small fundamental wave light source may be used in a configuration according to an embodiment of the present invention.

According to a wavelength conversion device or a wavelength conversion method according to an embodiment of the present invention, a noise of wavelength converted light may be reduced.

DESCRIPTION OF THE PREFERRED EMBODIMENTS

A best mode for carrying out the present invention will be described below; however, the present invention is not limited to the following examples.

Figure 2:
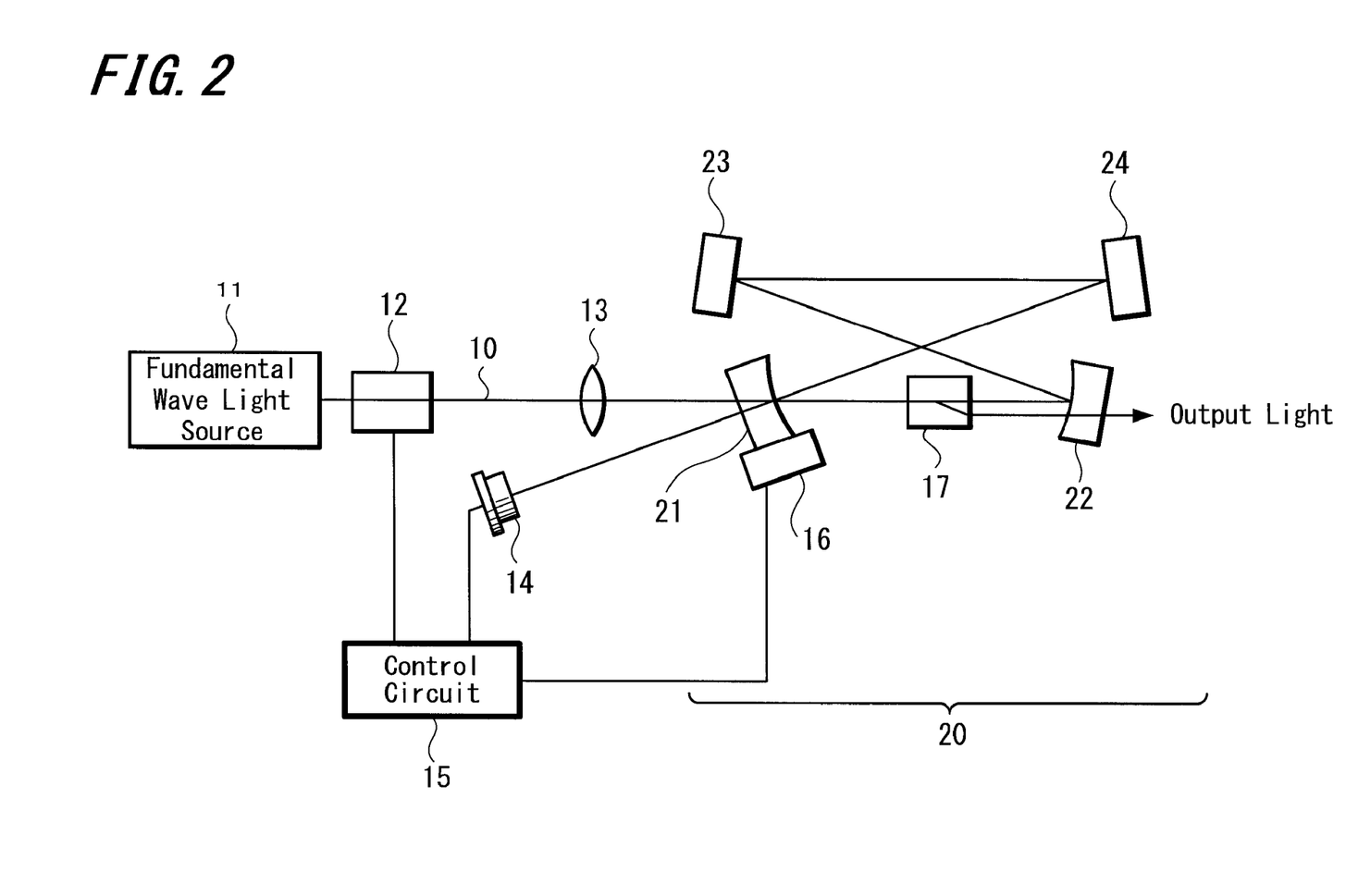
FIG. 2 is a schematic configuration diagram of an example of a wavelength conversion device according to an embodiment of the present invention.

FIG. 2 shows a schematic configuration diagram of an example of a wavelength conversion device according to an embodiment of the present invention. In this example, the wavelength conversion device includes a fundamental wave light source 11, a phase modulator 12 for obtaining a frequency error signal, a capacitor lens 13, a photodetector 14, a control circuit 15, and an external resonator 20. The external resonator 20 includes an input coupling element 21 having a semi-transmissive mirror having a predetermined transmittance, mirrors 22 to 24, and a nonlinear optical element 17 placed between the input coupling element 21 and the mirror 22.

In such a configuration, fundamental wave light emitted from the fundamental wave light source 11 is collected on the input coupling element 21 by the capacitor lens 13 through the phase modulator 12. Laser light incident to the external resonator 20 from the input coupling element 21 is amplified through multiple interference in the resonator, and output light wavelength converted by the nonlinear optical element 17 is output outside from a half mirror 22, for example. Light reflected by the input coupling element 21 is detected in the photodetector 14. A position of an electromagnetic actuator 16 is controlled by the control circuit 15 using a detection signal generated by the photodetector 14 to oscillate incident light, so that harmonic light may be efficiently obtained from the nonlinear optical element 17.

Figure 3:
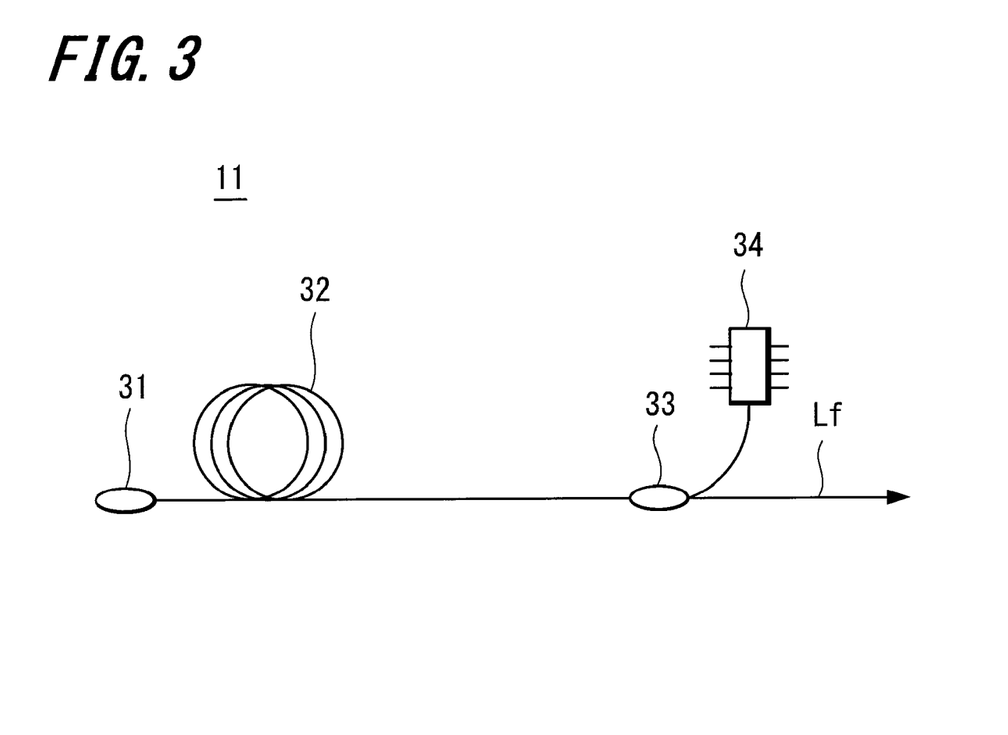
FIG. 3 is a schematic configuration diagram of an example of a distributed feedback (DFB) fiber laser.

In this wavelength conversion device, a distributed feedback (DFB) fiber may be used as the fundamental wave light source as shown in FIG. 3, for example. FIG. 3 shows a schematic configuration diagram of an example of the fundamental wave light source 11 using a DFB fiber. When using a DFB fiber, the fundamental wave light source generally includes at least the DFB fiber and an excitation laser, and a seed laser is used according to a wavelength of output light. In this example, a seed laser is not used. As shown in FIG. 3, this fundamental wave light source 11, for example, includes a wavelength division multiplexing (WDM) element 31; a DFB fiber 32 containing a rare earth element containing Er, Yb, or the like, such as Yb-containing DFB fiber 32; a wavelength division multiplexing element 33; and an excitation laser 34.

Excitation light output from the excitation laser 34 reciprocates between the wavelength division multiplexing elements 31 and 33 to excite the DFB fiber 32. Excited light is output the outside through the wavelength division multiplexing element 33 as indicated by an arrow Lf.

Light having a narrow spectral width, specifically, light in a single longitudinal mode may be obtained using such a DFB fiber laser.

Figure 4:
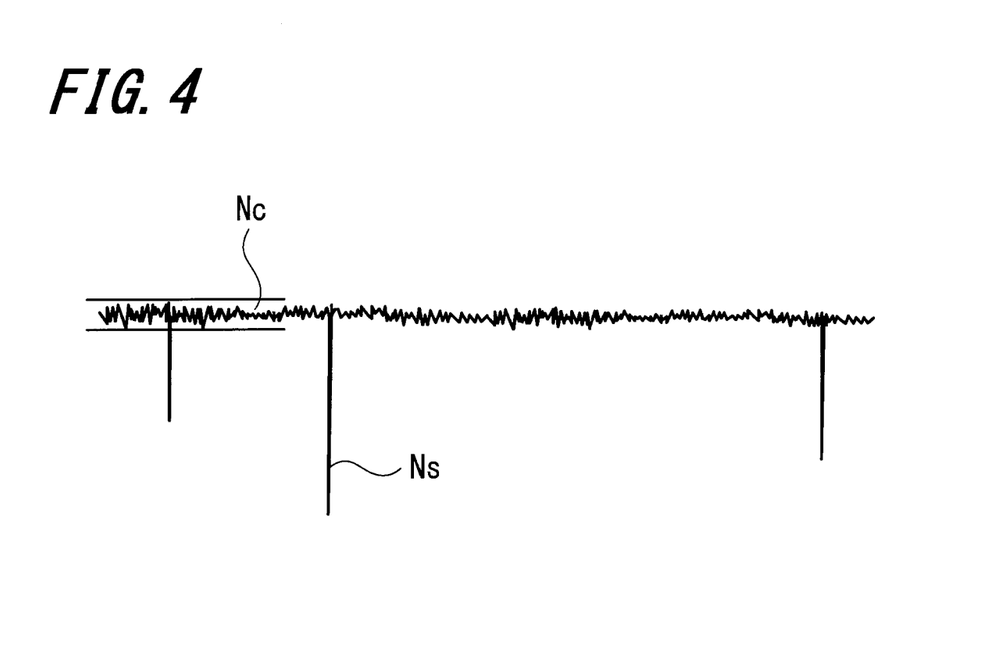
FIG. 4 is a view showing an example of an intensity noise of wavelength converted light.

FIG. 4 shows an example of a noise of a wavelength converted light output value when the wavelength conversion device shown in FIG. 2 is formed using such a DFB fiber laser. In this example, SHG (second harmonic generation) of the DFB fiber laser is used as the fundamental wave light source and an oscillation wavelength is 532 nm. β-BBO (β-BaB$_2$O$_4$, β-barium borate) is used as the nonlinear optical element used in the external resonator to output wavelength converted light having a wavelength of 266 nm. As shown in FIG. 4, a steady noise indicated by Nc is generated in the wavelength converted light. This is a noise at a frequency of about 100 kHz, where a peak-to-peak value is about 2%. In contrast, when a fundamental wave light source having a relatively high frequency jitter is used such as a DFB laser, a noise Ns is unsteadily generated in a wavelength converted light output value. This noise is a relatively high output noise, where a pulse width is about 10 μs and a peak-to-peak value is about 4 to 8%.

According to embodiments of the present invention, the relatively high noise was focused on when proceeding with the following discussion.

As described above, in a wavelength conversion device of the related art, a transmittance of an input coupling element in an external resonator $T_{in}$ ($=1-R_{in}$) is selected to be almost equal to a total internal loss in order to perform impedance matching for the external resonator. U.S. Pat. No. 5,027,361 discloses an example of selecting such a transmittance of an input coupling element taking into consideration wavelength conversion efficiency of a nonlinear optical element placed in an external resonator, in addition to such an internal loss.

In contrast, as described above, the present inventors have found that there is a more important factor for reducing a noise.

A typical noise source is an intensity noise of an excitation laser of a fundamental wave light source and disturbance, and the noise Nc shown in FIG. 4 corresponds to the noise source. The intensity noise and disturbance may be eliminated by increasing a loop gain of a servo circuit.

On the other hand, a noise is caused by a frequency jitter of an excitation laser of a fundamental wave light source. That is, an unsteady noise indicated by Ns in FIG. 4 appears in wavelength converted light when a jitter is provided by controlling a frequency of the fundamental wave light source.

Figure 5:
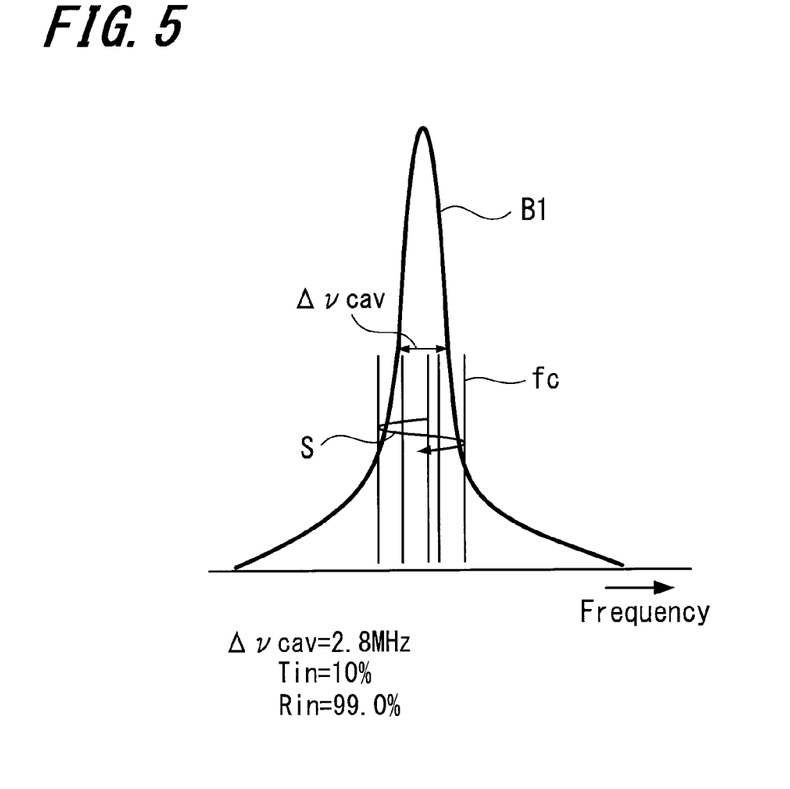
FIG. 5 is a view showing a frequency tolerance of an external resonator.
Figure 6:
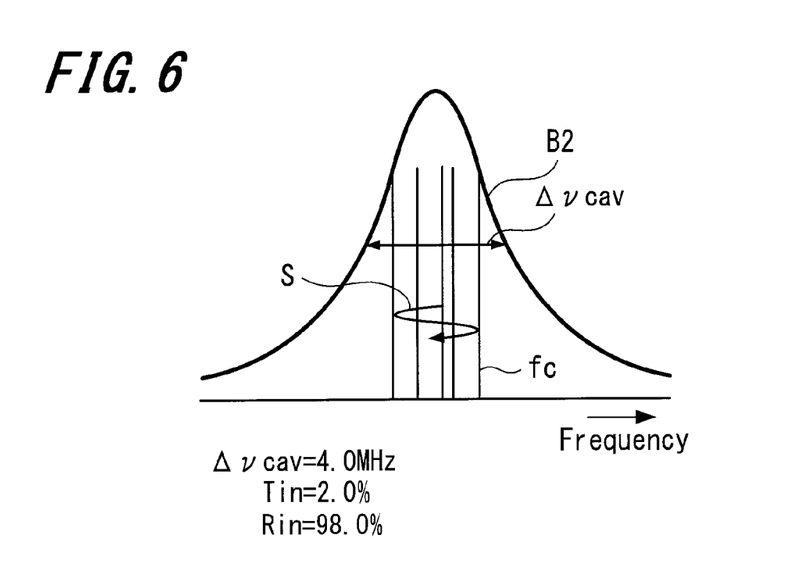
FIG. 6 is a view showing a frequency tolerance of an external resonator.

Accordingly, a physical model is proposed as shown in FIGS. 5 and 6. A bell-shaped curve shown in FIGS. 5 and 6 shows a frequency acceptance of an external resonator. A frequency line width $\Delta v_{cav}$ indicates FWMH (full width at half maximum). In FIGS. 5 and 6, a solid line fc indicates a frequency of a fundamental wave light source and indicates a state where the frequency fc jitters as indicated by an arrow s.

FIG. 5 indicates a frequency acceptance in a wavelength conversion device of the related art, where impedance matching is satisfied. In this case, a frequency line width $\Delta v_{cav}$ is 2.8 MHz, a transmittance of an input coupling element in an external resonator $T_{in}$ is 1.0%, and a reflectance of the input coupling element $R_{in}$ is 99.0%. When a transmittance (reflectance) of an input coupling element is selected by a method of the related art in this manner, a frequency acceptance indicated by a solid line B1 is relatively narrow as shown in FIG. 5. Accordingly, when a frequency fc jitters as indicated by an arrow s, coupling reduction may occur, thereby producing a noise of wavelength converted light if the frequency exceeds a tolerance in an external resonator.

In contrast, when the width of a frequency acceptance B2 is increased by reducing a finesse intentionally as shown in FIG. 6, even if a frequency of a fundamental wave light source fc jitters as indicated by an arrow s, the frequency will not exceed the tolerance of an external resonator so that a noise will not appear in wavelength converted light. FIG. 6 shows a case where a frequency line width $\Delta v_{cav}$ is 4.0 MHz, a transmittance of an input coupling element $T_{in}$ is 2.0%, and a reflectance of the input coupling element $R_{in}$ is 98.0%. In this case, a reflectance of the input coupling element is determined ignoring impedance matching by a method of the related art.

Figure 7:
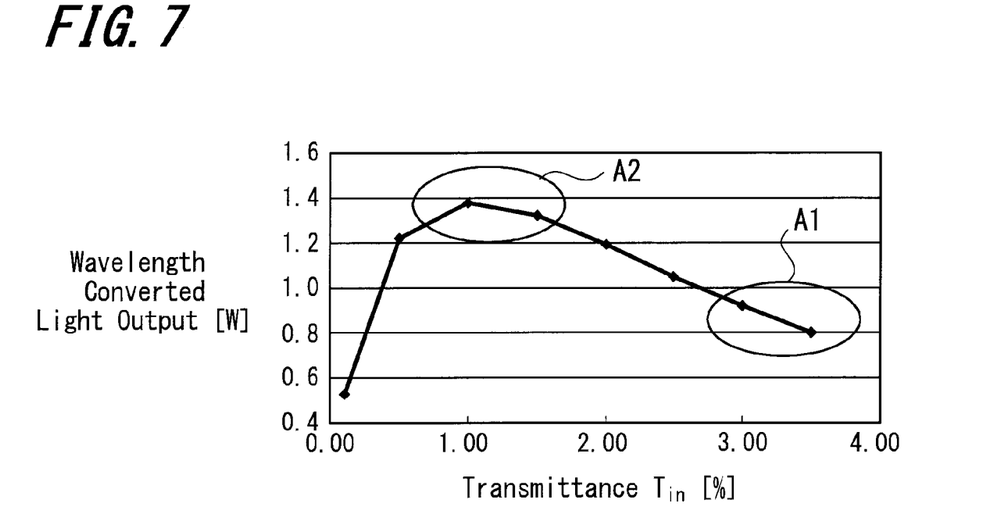
FIG. 7 is a view showing a change in an output of wavelength converted light with respect to a transmittance of an input coupling element.

Here, a change in output of wavelength converted light in the wavelength conversion device having a configuration shown in FIG. 2 will be analyzed, where an internal loss of the external resonator 20 is 1% and a transmittance of the input coupling element 21 $T_{in}$ is changed. In this example, SHG of a DFB fiber laser having a wavelength of 532 nm is used as the fundamental wave light source and BBO is used as the nonlinear optical element to output ultraviolet light having a wavelength of 266 nm. The results are shown in FIG. 7. In a case where a transmittance of the input coupling element 21 $T_{in}$ is about 1% which is almost equal to an internal loss (as indicated by a region A2), impedance is matched, and an output of ultraviolet light is maximized as is maximizing efficiency.

In a method of the related art, as described above, a transmittance of the input coupling element 21 is designed to satisfy the expression (1):

$$T_{in} \approx \delta \quad (1)$$

where $T_{in}$ represents a transmittance and $\delta$ represents a total internal loss.

In an embodiment of the present invention, a reflectance of the input coupling element $R_{in}$ is selected based on the expression 1 to determine a frequency line width of the external resonator, so that a maximum frequency jitter of an excitation laser $\Delta f_{jitter}$ satisfies the expression (2):

$$\Delta v_{cav} \geq \Delta f_{jitter} \quad (2)$$

as represented by the expression (2).

For example, when the aforementioned DFB semiconductor laser as shown in FIG. 3 is used as the fundamental wave light source 11, a $\Delta f_{jitter}$ is about several MHz, and a transmittance of the input coupling element $T_{in}$ determined based on the $\Delta f_{jitter}$ is about 3% which falls in a range indicated by a region A1 in FIG. 7.

Figure 8:
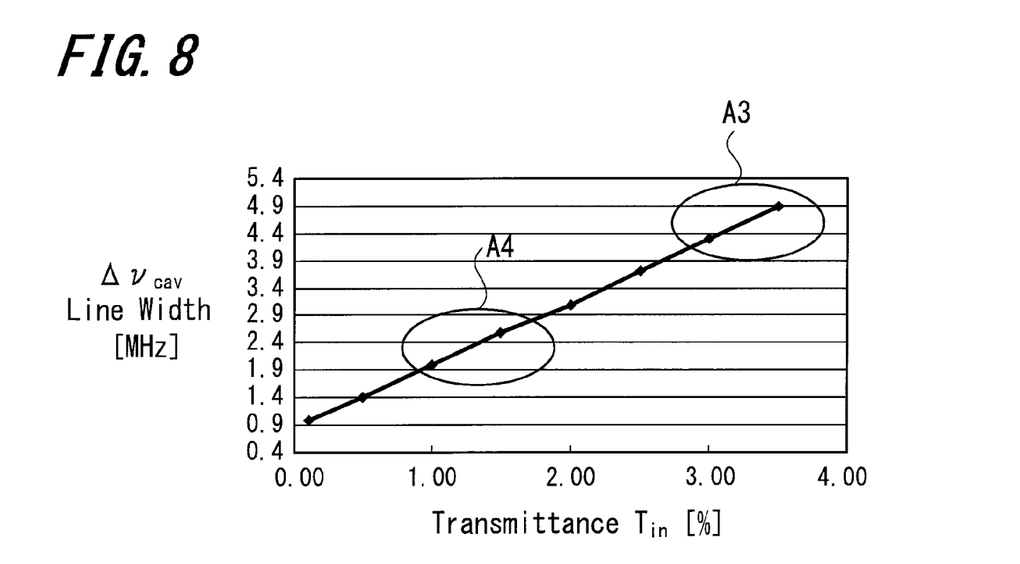
FIG. 8 is a view showing a change in a frequency line width of an external resonator with respect to a transmittance of an input coupling element.

FIG. 8 shows a change in a frequency line width with respect to a transmittance of the input coupling element. A transmittance selected by a method of the related art obtained falls in a range indicated by a region A4, and a frequency line width $\Delta v_{cav}$ is relatively small and is about 2.8 MHz as in the aforementioned example shown in FIG. 5, for example.

In contrast, a transmittance selected by a method of an embodiment of the present invention obtained falls in a range indicated by a region A3, and a frequency line width $\Delta v_{cav}$ is relatively large and is about 4 MHz as in the example shown in FIG. 6, for example.

When an NPRO (non-planar ring oscillator) type laser is used as the fundamental wave light source, for example, the laser has a frequency line width of about 1 kHz to several kHz. Accordingly, a noise scarcely appears in wavelength converted light even in a configuration the same as that of the related art.

On the other hand, when using, as the fundamental wave light source, a laser apparatus having a frequency line width of more than 100 kHz, specifically, a laser apparatus having a frequency line width represented by the expression:

$$\Delta v_{cav} > 100 \text{ kHz} \quad (3)$$

The fundamental wave light source according to an embodiment of the present invention may preferably be used to select a reflectance of the input coupling element in the external resonator according to the expression (2) and the expression (1).

Figure 9:
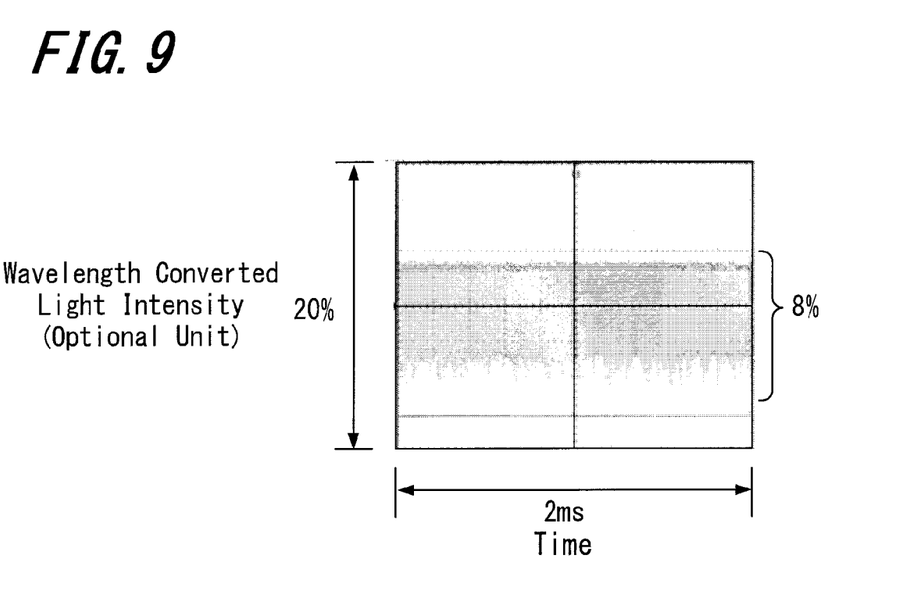
FIG. 9 is a view showing a comparative example of a wavelength converted light intensity.
Figure 10:
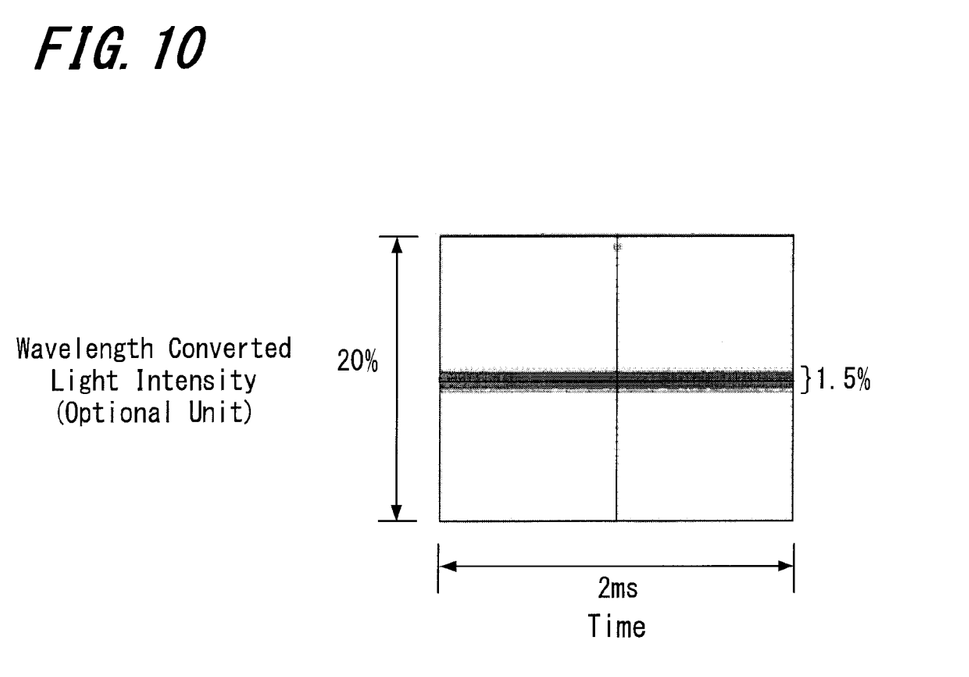
FIG. 10 is a view showing an example of a wavelength converted light intensity in a wavelength conversion device according to an embodiment of the present invention.

Specifically, SHG of a DFB fiber laser having an oscillation wavelength of 532 nm, for example, is used as the fundamental wave light source, BBO is used as the nonlinear optical crystal of the external resonator, and an internal loss is 0.2%. In this case, a wavelength converted light intensity is measured for a comparative example in which a transmittance of the input coupling element in the external resonator $T_{in}$ (that is, a reflectance $R_{in}$) is selected by a method of the related art and for an embodiment of the present invention in which a reflectance $R_{in}$ is selected based on the expression 1 and the expression (2). The results are shown in FIGS. 9 and 10. As is clear from comparison of the comparative example with the embodiment, a noise of a wavelength converted light output may be remarkably reduced according to an embodiment of the present invention.

As a frequency line width $\Delta v_{cav}$ is increased, a frequency acceptance increases, so that an effect by a frequency noise may be reduced. However, when $\Delta v_{cav}$ exceeds 200 MHz, a finesse is 2 or less. Accordingly, an advantage of using a resonator, that is, an amplification effect by multiple interference may not be achieved and an output may be decreased. Therefore, in a wavelength conversion device or a wavelength conversion method according to an embodiment of the present invention, a reflectance of an input coupling element in an external resonator is preferably selected so that a frequency line width $\Delta v_{cav}$ is less than 200 MHz. In practice, a frequency line width $\Delta v_{cav}$ is preferably about 2 MHz to several tens MHz.

Figure 11:
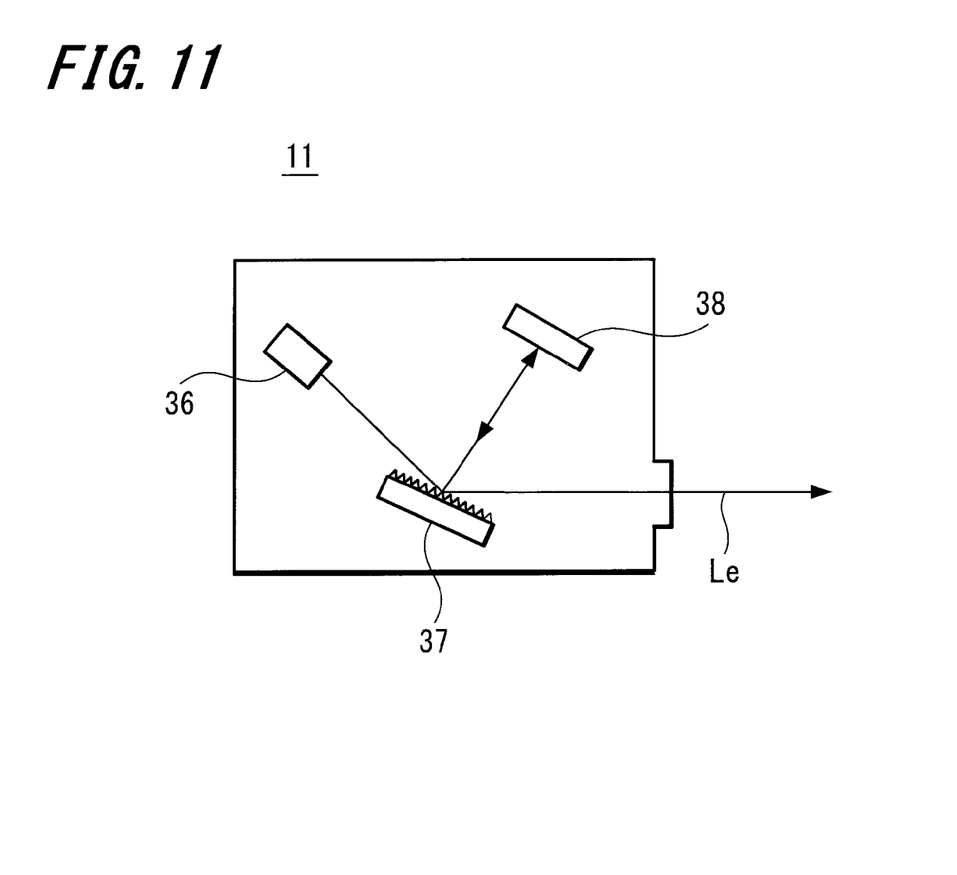
FIG. 11 is a schematic configuration diagram of an example of an external resonator diode laser.
Figure 12:
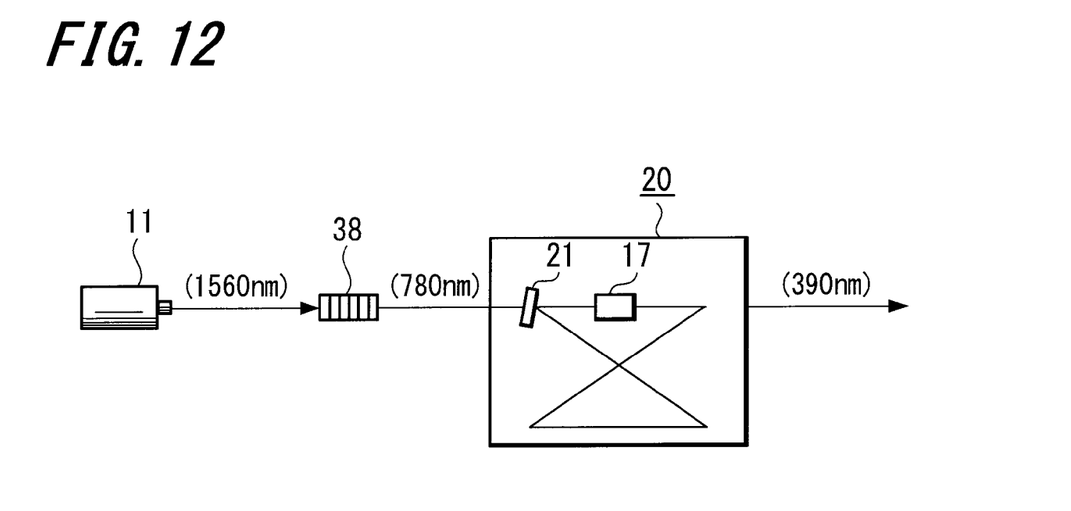
FIG. 12 is a schematic configuration diagram of an example of a wavelength conversion device according to an embodiment of the present invention.

In the above-described example, a DFB semiconductor laser is used as a fundamental wave light source; however, an embodiment of the present invention is used in cases where various other lasers are used such as semiconductor lasers having a relatively high frequency jitter. For example, an embodiment of the present invention is also used in a case where an external resonator diode laser (ECDL) shown in FIG. 11 is used. In this case, a fundamental wave light source 11 includes an excitation light source 36 such as a semiconductor laser, a reflection grating 37 and a mirror 38. Light emitted from the excitation light source 36 is reflected at the reflection grating 37 and is reflected by the mirror 38 such as a retroreflector, thereby outputting an excitation laser Le (fundamental wave light). In a case where such an ECDL-type semiconductor laser is used as a fundamental wave light source, a noise of wavelength converted light may be remarkably reduced as in the aforementioned embodiment.

As described above, according to a wavelength conversion device according to an embodiment of the present invention, an intensity noise of wavelength converted light may be remarkably reduced. In particular, in a case where a light source having a high frequency jitter such as a DFB fiber laser, ECDL, or DFG semiconductor laser is used as a fundamental wave light source, an intensity noise of wavelength converted light may be reliably reduced. That is, a relatively inexpensive laser light source such as a DFB fiber laser may be used as a fundamental wave light source, a cost may be reduced, and a device may be simplified and reduced in size.

A noise of wavelength converted light may be reduced according to an embodiment of the present invention. Therefore, when an embodiment of the present invention is used in an illumination light source used for the aforementioned inspection apparatus for a semiconductor apparatus, a semiconductor wafer, or the like (wavelength: 190 to 900 nm, for example), excellent inspection may be performed without impairing inspection accuracy.

Further, when a wavelength conversion device or a wavelength conversion method according to an embodiment of the present invention is used in an illumination light source for a projector as an imaging apparatus (wavelength: 400 to 600 nm, for example), a noise of the illumination light may be reduced and an excellent image may be displayed. Moreover, wavelength converted light output from a wavelength conversion device according to an embodiment of the present invention may be used as an illumination light source for a dark field microscope by which high-speed scanning is preferably performed. A noise may be reduced also in this case, and therefore excellent microscopic observation may be performed. In addition, when an embodiment of the present invention is used for light source devices in which various kinds of wavelength conversion are performed such as a laser for PDT (photodynamic therapy) (wavelength: 500 to 700 nm, for example), a laser for a disc cutter (wavelength: 190 to 400 nm, for example), a light source for a laser show (wavelength: 450 to 680 nm, for example), and a fluorescent material excitation laser (wavelength: 190 to 400 nm, for example), a noise may be reduced, a cost may be reduced, and a device may be simplified and reduced in size.

A wavelength conversion device according to an embodiment of the present invention may have the aforementioned configuration as shown in FIG. 2, or may alternatively have a configuration as shown in FIGS. 12 to 16, for example. In FIGS. 12 to 16, parts corresponding to those of FIG. 2 are indicated by the same symbols, and repeated description is omitted. In FIGS. 12 to 16, mirrors other than an input coupling element in an external resonator are omitted. In an example shown in FIG. 12, light from a fundamental wave light source 11 having an oscillation wavelength of 1,560 nm, for example, is input in a nonlinear optical element of LN (lithium niobate, $LiNbO_3$) in which a periodic polarization inversion structure is formed, for example; converted to a second harmonics having a wavelength of 780 nm; and input in an external resonator 20. In this case, the same effect may be achieved by selecting a reflectance of the input coupling element in the external resonator 20 according to the expressions 1 and 2 (that is, the expression (2)).

Figure 13:
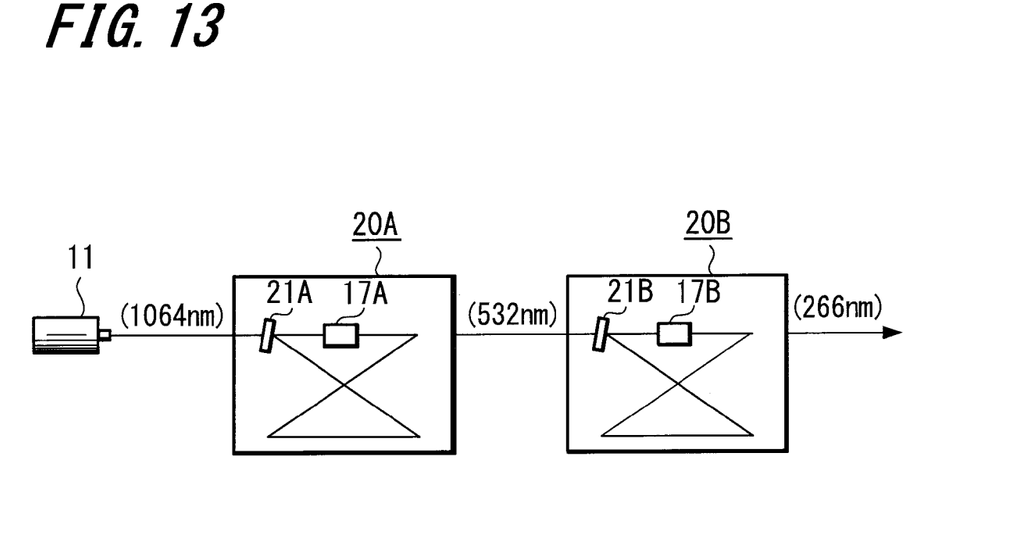
FIG. 13 is a schematic configuration diagram of an example of a wavelength conversion device according to an embodiment of the present invention.

FIG. 13 shows an example in which external resonators 21A and 21B are arranged in series. Specifically, in this case, light having a wavelength of 1,064 nm is input from a fundamental wave light source 11 to the external resonator 20A to output light having a wavelength of 532 nm, and the light is further input to the external resonator 20B to output light having a wavelength of 266 nm. In this case, a noise may be reduced and the same effect may be achieved by selecting a reflectance of the input coupling elements 21A and 21B in the external resonators 20A and 20B according to the expressions 1 and 2. An embodiment of the present invention may be used for only one of the input coupling elements. Also in this case, a noise may be reduced as compared with a case of the related art.

Figure 14:
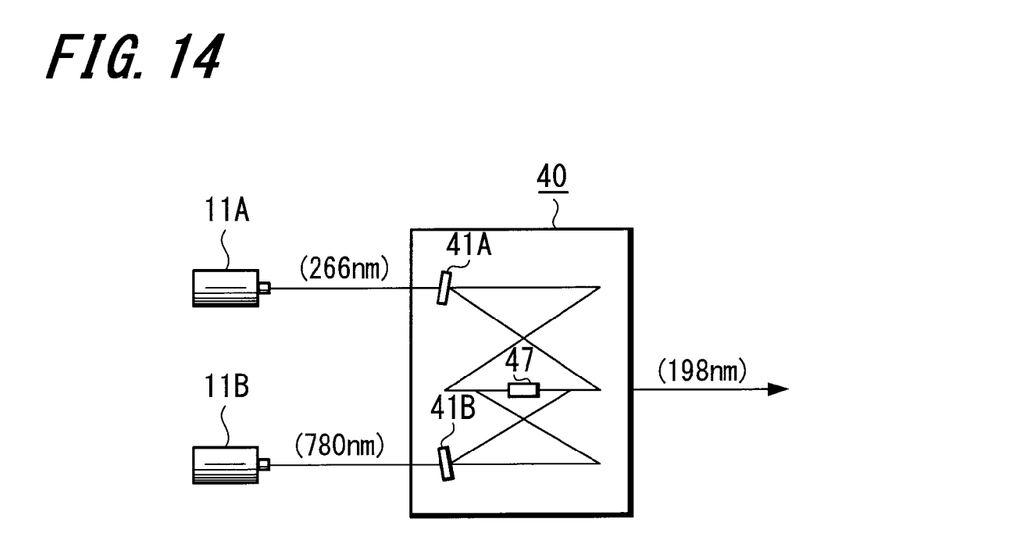
FIG. 14 is a schematic configuration diagram of an example of a wavelength conversion device according to an embodiment of the present invention.

FIG. 14 shows a case where an external resonator 40 is a sum frequency mixing type. Light having a wavelength of 266 nm is input from a fundamental wave light source 11A and light having a wavelength of 780 nm is input from a fundamental wave light source 11B to output light having a wavelength of 198 nm. Also in this case, a noise may be reduced and the same effect can be achieved by selecting a reflectance of input coupling elements 41A and 41B according to the expressions 1 and 2. Reference numeral 47 in FIG. 14 denotes a nonlinear optical element.

Figure 15:
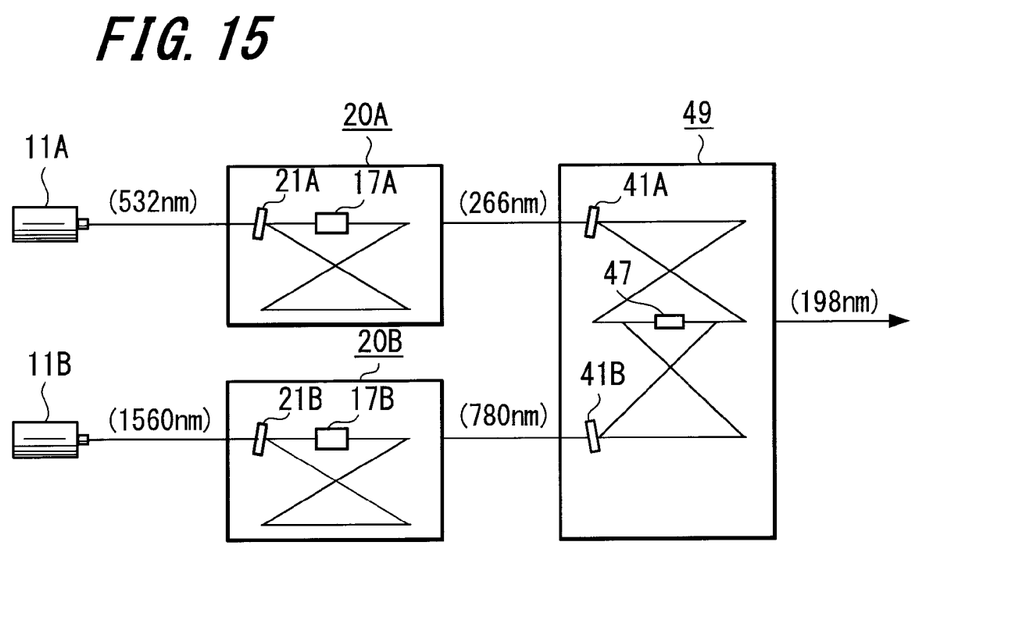
FIG. 15 is a schematic configuration diagram of an example of a wavelength conversion device according to an embodiment of the present invention.

FIG. 15 shows a case where two fundamental wave light sources 11A and 11B, two external resonators 20A and 20B and a sum frequency mixing type external resonator 40 are used. Light having a wavelength of 532 nm is input to the external resonator 20A from the one fundamental wave light source 11A, and light having a wavelength of 1,560 nm is input to the external resonator 20B from the other fundamental wave light source 11B. Lights having a wavelength of 266 nm and 780 nm each output from the external resonators 20A and 20B are input to the external resonator 40 to output light having a wavelength of 198 nm by sum frequency mixing. In this case, a noise may be reduced and the same effect may be achieved by selecting a reflectance of each of the input coupling elements 21A and 21B in the external resonators 20A and 20B and a reflectance of each of two input coupling elements 41A and 41B in the external resonator 40 according to the expressions 1 and 2. An embodiment of the present invention may be used in at least one of the input coupling elements. Also in this case, a noise may be reduced as compared with a case of the related art. Reference numerals 17A, 17B and 47 in FIG. 15 each denote a nonlinear optical element.

Figure 16:
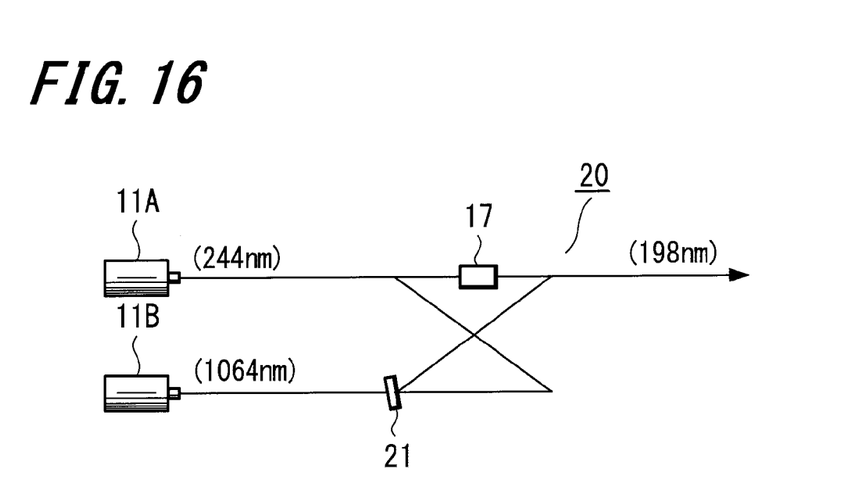
FIG. 16 is a schematic configuration diagram of an example of a wavelength conversion device according to an embodiment of the present invention.

Further, as shown in FIG. 16, an embodiment of the present invention may be used in a case where fundamental wave light sources 11A and 11B are used and only light from the one fundamental wave light source 11B is subjected to multiple interference in an external resonator 20. In this case, light having a wavelength of 244 nm is caused to pass through a nonlinear optical element 17 in the external resonator 20 from the fundamental wave light source 11A and light having a wavelength of 1,064 nm from the fundamental wave light source 11B is input to the external resonator 20 from an input coupling element 21 to output light having a wavelength of 198 nm. Also in this case, a noise may be reduced and the same effect can be achieved by selecting a reflectance of the input coupling element 21 according to the expressions 1 and 2.

As described above, an embodiment of the present invention may also be used in a case where a fundamental wave light source includes a wavelength conversion section, for example, an external resonator-type wavelength conversion section that outputs SHG light. In this case, a fundamental wave light source includes an external resonator and a reflectance of an input coupling element is selected according to the expressions 1 and 2, so that a noise may be reduced.

In a case where a fundamental wave light source includes two or more external resonators, when a reflectance of an input coupling element in at least one of the external resonators is selected as represented by the expressions 1 and 2, a noise may be reduced as compared with a case of the related art.

An embodiment of the present invention is not limited to a wavelength conversion device having a configuration shown in each of the aforementioned embodiments. Various transformations and modifications are possible without departing from the scope of the present invention, where a fundamental wave light source is connected to an external resonator through a fiber or the like, for example.

It should be understood by those skilled in the art that various modifications, combinations, sub-combinations and alterations may occur depending on design requirements and other factors insofar as they are within the scope of the appended claims or the equivalents thereof.

What is claimed is:

1. A wavelength conversion device comprising:
    at least a fundamental wave light source and an external resonator, wherein
    a reflectance $R_{in}$ of an input coupling element that inputs light from the fundamental wave light source to the external resonator is selected as represented by the equations 1 and 2, when a frequency jitter of the fundamental wave light source is $\Delta f_{jitter}$, a resonator length of the external resonator is $L_{cav}$, a frequency line width of the external resonator is $\Delta v_{cav}$, a total internal loss of the external resonator is $\delta$, and a speed of light is c, $$\Delta v_{cav} = \frac{c}{L_{cav}} \times \frac{1 - \sqrt{R_{in}(1-\delta)}}{\pi (R_{in}(1-\delta))^{1/4}} \quad (1)$$

$$\Delta v_{cav} \geq \Delta f_{jitter} \quad (2)$$

2. A wavelength conversion device according to claim 1, wherein the fundamental wave light source has a frequency jitter $\Delta f_{jitter}$ of more than 100 kHz.

3. A wavelength conversion device according to claim 1, wherein
    the fundamental wave light source includes a distributed feedback semiconductor laser, an external resonator diode laser, or a distributed feedback fiber laser.

4. A wavelength conversion device according to claim 3, wherein
    the fundamental wave light source includes a wavelength conversion section.

5. A wavelength conversion device according to claim 1, wherein
    the wavelength conversion device includes the two or more external resonators and a reflectance $R_{in}$ of the input coupling element in at least one of the external resonators is selected as represented by the equations 1 and 2.

6. A wavelength conversion method comprising the step of:
    inputting light emitted from a fundamental wave light source to an external resonator to perform wavelength conversion, wherein
    a reflectance $R_{in}$ of an input coupling element that inputs light from the fundamental wave light source to the external resonator is selected as represented by the equations 1 and 2, when a frequency jitter of the fundamental wave light source is $\Delta f_{jitter}$, a resonator length of the external resonator is $L_{cav}$, a frequency line width of the external resonator is $\Delta v_{cav}$, a total internal loss of the external resonator is $\delta$, and a speed of light is c, $$\Delta v_{cav} = \frac{c}{L_{cav}} \times \frac{1 - \sqrt{R_{in}(1-\delta)}}{\pi (R_{in}(1-\delta))^{1/4}} \quad (1)$$

$$\Delta v_{cav} \geq \Delta f_{jitter} \quad (2)$$

* * * * *